US009070865B1

(12) United States Patent
Snook et al.

(10) Patent No.: US 9,070,865 B1
(45) Date of Patent: Jun. 30, 2015

(54) TRANSVERSE MODE MULTI-RESONANT SINGLE CRYSTAL TRANSDUCER

(71) Applicant: TRS TECHNOLOGIES, INC., State College, PA (US)

(72) Inventors: Kevin A. Snook, State College, PA (US); Yu Liang, State College, PA (US); Jun Luo, State College, PA (US); Wesley S. Hackenberger, State College, PA (US); Raffi Sahul, State College, PA (US)

( * ) Notice: Subject to any disclaimer, the term of this patent is extended or adjusted under 35 U.S.C. 154(b) by 377 days.

(21) Appl. No.: 13/655,859

(22) Filed: Oct. 19, 2012

Related U.S. Application Data

(60) Provisional application No. 61/548,967, filed on Oct. 19, 2011.

(51) Int. Cl.
*H01L 41/09* (2006.01)

(52) U.S. Cl.
CPC ................... *H01L 41/0986* (2013.01)

(58) Field of Classification Search
CPC .................................................. H01L 41/0986
USPC ......................................................... 310/325
See application file for complete search history.

(56) References Cited

U.S. PATENT DOCUMENTS

| 6,457,365 B1 | 10/2002 | Stephens et al. |
| 2014/0042574 A1* | 2/2014 | Carman et al. ................. 257/421 |

* cited by examiner

*Primary Examiner* — Derek Rosenau
(74) *Attorney, Agent, or Firm* — McNees Wallace & Nurick LLC

(57) ABSTRACT

A transducer is disclosed that includes a multiply resonant composite, the composite having a resonator bar of a piezoelectric single crystal configured in a $d_{32}$ transverse length-extensional resonance mode having a crystallographic orientation set such that the thickness axis is in the <110> family and resonance direction is the <001> family.

21 Claims, 6 Drawing Sheets

TRANSVERSE MODE MULTI-RESONANT SINGLE CRYSTAL TRANSDUCER

CROSS-REFERENCE TO RELATED APPLICATIONS

This application claims the benefit of and priority to U.S. Application No. 61/548,947 filed Oct. 19, 2011, which is hereby incorporated by reference in its entirety.

STATEMENT REGARDING FEDERALLY SPONSORED RESEARCH

A portion of one or more of the inventions disclosed herein was developed under NIH SBIR contract 2R44EB001516-02A1 and under NASA SBIR contract NNX11CE37P. The U.S. government may have certain rights in this invention.

FIELD

The present disclosure is directed to single crystal transducers and more particularly to multi-resonant single crystal transducers.

BACKGROUND

Existing ultrasound transducers are mostly based on piezoelectric materials operating in the longitudinal length-extensional $d_{33}$ mode. Ultrasound composites are commonly operated in a longitudinal length-extensional mode, with bars of identical dimensions embedded in an epoxy matrix and electrodes applied to the common surface formed by the ends of the bars. This design produces a single resonant frequency.

The predominant material in ultrasound composites employing piezoelectrics is lead zirconium titanate (PZT) ceramics, although alternative materials such as polyvinylidene difluoride (PVDF) are also used. To maximize performance, the PZT is formed into 1-3 composites, which achieve bandwidths of up to approximately 80%. Although PVDF provides bandwidths in excess of 100%, it does so at the expense of sensitivity. Furthermore, the electromechanical coupling of longitudinal length-extensional modes of the PZT and PVDF are generally less than 70% and 10%, respectively. These low coupling values do not make it advantageous to use the longitudinal length-extensional modes for sensitive, multi-octave bandwidth transducers.

In piezoelectric devices using the $d_{33}$ mode, frequency is inversely proportional to piezoelectric thickness. Lower frequency transducers thus require thicker material. However, voltage requirements scale with material thickness, meaning that higher voltages are also required. As a result, low frequency transducers made with conventional technology are large and consume more power. High frequency transducers, on the other hand, require smaller feature sizes. These small feature sizes are difficult to produce with conventional processing techniques (i.e. dicing saw), but capacitance of the elements decreases and requires the system to be more complicated to achieve adequate sensitivity.

Accordingly, known transducers are generally limited to a bandwidth centered around a single resonance because a single transducer is generally not capable of spanning both high and low frequencies, particularly in small sizes. As a result, bandwidth is not adequate for certain end-use applications and multiple transducer probes may be necessary.

The limited bandwidth of current transducers centered around a single resonance affects acoustic diagnostic techniques. Performing measurements on a target material (e.g. biological tissue or a metal structure) may require different frequencies to identify different structural parameters. Using multiple probes to achieve measurements at differing bandwidths is unsatisfactory because it adds uncertainty whether the same spatial area is being evaluated.

Limited bandwidth also affects acquiring acoustic information at multiple distances from the transducer if frequency-dependent attenuation in the target material is a significant factor.

A specific example of these limitations can be seen in in vivo analysis of bone for osteoporosis quantification, where diagnostic techniques have been studied in frequency bands from 300 kHz to greater than 5 MHz and in areas of the body such as the calcaneus (ankle), the hip and lower back. These body regions have varying amounts of muscle and fat tissues between the transducer and bone.

These and other drawbacks are found in known transducers.

SUMMARY

Exemplary embodiments are directed to transverse-mode multi-resonant single crystal transducers that overcome some or all of these drawbacks.

The single crystal crystallographic orientation of exemplary embodiments is set such that the transverse length-extensional resonance ($d_{32}$) is maximized, which means the thickness axis is in the <110> family and resonance direction is the <001> family. The transducer provides great flexibility in resonance frequency, and provides a means to produce very low frequency ultrasound inspection in a compact structure.

In accordance with an exemplary embodiment, a transducer comprises a multiply resonant composite, the composite comprising a resonator bar of a piezoelectric single crystal configured in a $d_{32}$ transverse length-extensional resonance mode having a crystallographic orientation set such that the thickness axis is in the <110> family and resonance direction is the <001> family.

In accordance with another exemplary embodiment, a transducer comprises a multiply resonant composite, the composite comprising a plurality of resonator bars of a piezoelectric single crystal, the plurality of resonator bars configured in a $d_{32}$ transverse length-extensional resonance mode having a crystallographic orientation set such that the thickness axis is in the <110> family and resonance direction is the <001> family in which the resonator bars are of at least two different lengths to produce at least two different $d_{32}$ resonant frequencies. The resonator bars are attached to a flexible polymeric film wrapped at least one complete revolution about a central structure.

In accordance with yet another exemplary embodiment, a transducer comprises a multiply resonant composite, the composite comprising a first plurality of resonator bars of a piezoelectric single crystal, each resonator bar of the first plurality of resonator bars configured in a $d_{32}$ transverse length-extensional resonance mode having a crystallographic orientation set such that the thickness axis is in the <110> family and resonance direction is the <001> family, the composite further comprising a second plurality of resonator bar of a piezoelectric single crystal, the second plurality of resonator bars each being configured in a $d_{33}$ longitudinal length-extensional resonance mode. The first and second plurality of resonator bars are attached to a flexible polymeric film at least partially wrapped about a structure having a length dimension that is parallel with the length dimension of the first plurality of resonator bars.

One advantage of exemplary embodiments is that devices are provided that operate in the transverse length-extensional mode with the electric field applied orthogonally to the extensional direction, such that resonators of different lengths share common electrodes.

Yet another advantage is that employing a group of different sized resonators in combination with a piezocrystal, multiple resonances can be made to overlap to provide a wide-bandwidth characteristic.

Still another advantage of exemplary embodiments is that the drive voltage of the piezocrystal transducer can be an order of magnitude less than resonators in the $d_{33}$ resonance mode, while maintaining comparable strain, since the applied electric field is not dependent on the extensional length.

These and other features and advantages of the present disclosure will be apparent from the following more detailed description of preferred embodiments, taken in conjunction with the accompanying drawings, that illustrate, by way of example, the principles of the invention.

DETAILED DESCRIPTION OF EXEMPLARY EMBODIMENTS

Exemplary embodiments are directed to a transducer that includes a multiply resonant composite in which the composite has a resonator bar formed of a piezoelectric single crystal. The crystallographic orientation of the crystal is set so that the thickness axis is in the <110> family and resonance direction is the <001> family and thereby configured in the transverse length-extensional resonance mode. A composite comprising a pattern of resonator bars with common electrodes at least partially wraps around a central mandrel and is used to form a transducer. The radiating faces of the $d_{32}$ resonators are substantially coplanar and can be driven in electrical parallel or individually, depending on the electrical inter-connection and drive system.

Composites for ultrasound transducers in accordance with exemplary embodiments are fabricated from a piezoelectric single crystal, with the crystal orientation set such that the transverse length-extensional resonance ($d_{32}$) is maximized. The single crystal may be a piezoelectric single crystal of any composition, but is typically lead magnesium niobate-lead titanate ("PMN-PT") or ternary-doped compositions of PMN-PT, such as indium-doped PMN-PT ("PIN-PMN-PT"). The binary and ternary compositions may be further doped, such as manganese-doped PMN-PT ("Mn:PMN") and manganese-doped PIN-PMN-PT ("Mn:PIN"). Compared to more commonly used piezoceramics, PMN-PT piezocrystals have superior piezoelectric and elastic properties that result in devices with superior bandwidth, source level, and power requirements. The anisotropy of PMN-PT relative to PZT provides advantages of superior electromechanical coupling, piezoelectricity and dielectric constants that can be accomplished through domain engineering.

Devices in accordance with exemplary embodiments use the transverse length-extensional resonance as a predominant mode of acoustic transmission and/or reception. Transducers made in accordance with exemplary embodiments can span frequencies as low as approximately 20 kHz to as high as about 15 MHz. In some cases, even lower or higher frequencies may be achieved.

In one embodiment, the composite is fabricated using a deep reactive ion etching technique that allows for multiple resonator bars of varying lengths to be formed simultaneously. The composite may be formed with as many different $d_{32}$ resonances as there are different lengths of bars. The number of different $d_{32}$ resonances and thus the particular length of the corresponding resonator bars used to achieve those resonances may depend on a variety of factors, which are typically dependent on the application for which the resulting transducer is designed. As with the number of different $d_{32}$ resonances used to form a particular pattern, the number of times that a pattern is repeated may also depend on multiple factors, including the particular end-use of the transducer for which the composite is used to create.

Figure 1:
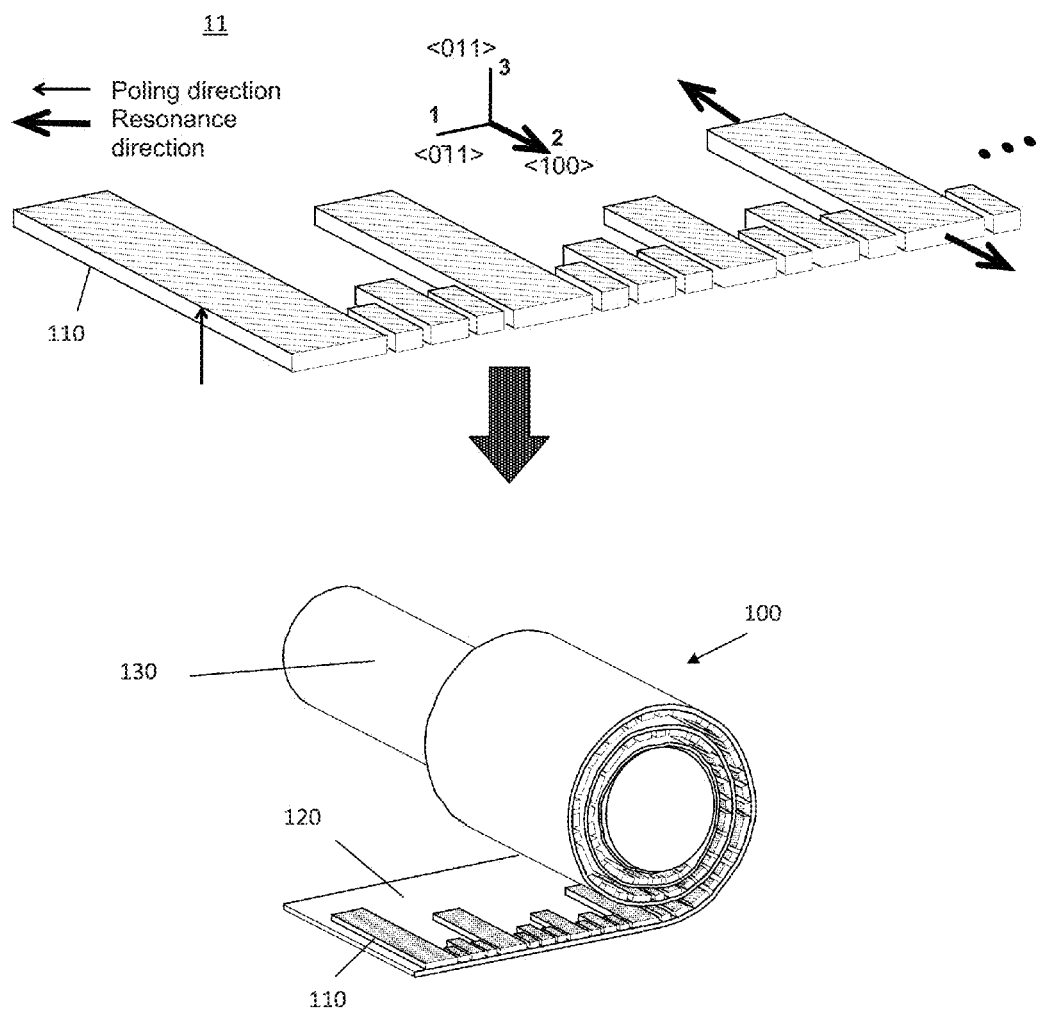
FIG. 1 illustrates a composite in accordance with an exemplary embodiment of the invention.

An exemplary unit 11 of a repeating pattern of resonator bars 110 is shown in FIG. 1, which also illustrates the crystallographic axis and the crystallographic orientation of the crystal, which is set so that the thickness axis (and thus the poling direction) of the resonator bars 110 is in the <110> family and the resonance direction is the <001> family, being thereby configured in the $d_{32}$ transverse length-extensional resonance mode.

The thickness of resonator bars used in connection with exemplary embodiments may range from between about 20 microns up to about 500 microns, more typically between about 20 to about 100 microns. Where the thickness is about 50 microns or less, the crystal exhibits a level of flexibility that assists in wrapping. However it will be appreciated that spacing between resonator bars may also be adjusted depending upon the thickness of the bars and the size of the mandrel about which the composite will be wrapped to achieve a more uniform wrapping. The length of resonator bars used in connection with exemplary embodiments may range from between approximately 50 microns up to about 3 cm. The length to thickness aspect ratio of the resonator bars may range from about 1 to more than 50, more typically between about 2.5 to about 10. The length to width aspect ratio of the resonator bars may range from about 1.3 to 10, more typically between about 1.5 to about 5.

Figure 2:
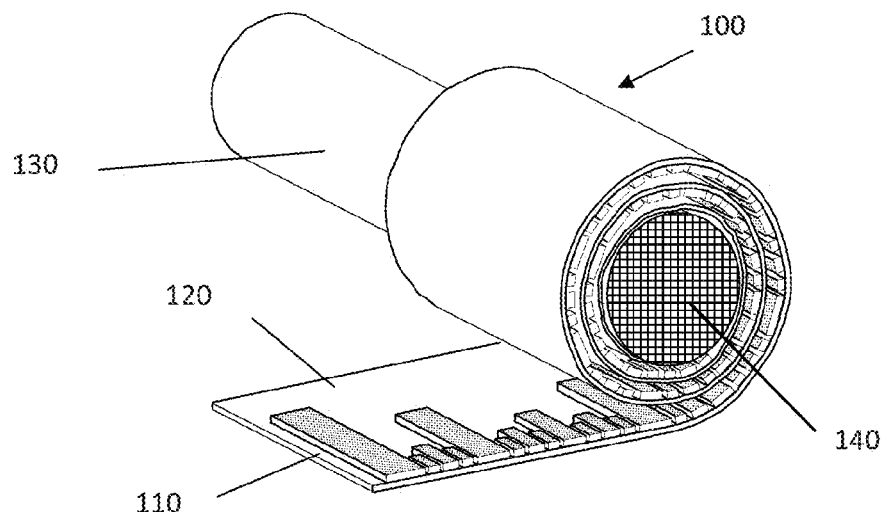
FIG. 2 illustrates a composite in accordance with another exemplary embodiment of the invention.

The composite can be formed or placed onto a flexible substrate and thereafter partially wrapped around a central structure. Typically the composite is wrapped entirely around the structure at least once and in some cases may be wrapped around the structure multiple times, forming a spiral orientation (also referred to herein as a "nautilus" design), as shown in FIGS. 1 and 2.

FIG. 1 further illustrates a multi resonant composite 100 employing the repeating pattern 11 of the multiple resonator bars 110, the bars 110 being of common thickness and different lengths that are attached to a flexible backing 120. The flexible backing 120 may be a polymeric film such as the polyimide films available from DuPont under the trademark KAPTON. Other flexible non-conducting materials may also be used.

The backing 120 on which the resonator bars 110 are situate is wrapped about a mandrel 130 to form the wrapped or nautilus composite design. The mandrel 130 may be any suitable material; while generally wood or plastic are preferred due to their low acoustic impedances, metal or any other material can also be used.

The use of the transverse length-extensional resonance mode and wrapping the composite 100 having multiple resonator bars 110 around a mandrel 130 or other central structure results in a multi-element transducer that looks similar to more conventional single element ultrasound transducers. Despite the similarity in size and appearance (and thus the ability to be used in conjunction with conventional testing apparatus), transducers in accordance with exemplary embodiments exhibit an effective bandwidth of 4 octaves or greater. Although primarily illustrated and discussed herein with respect to wrapping the composite 100 around a mandrel 130 of circular cross-section, it will be appreciated that other shaped structures also could be used, including elliptical or even straight sided polygons, although in such cases rounded edges are still preferred.

FIG. 2 illustrates an alternative embodiment in which a conventional $d_{33}$ 1-3 composite 140 is mounted on the front face of the mandrel 130, which can operate in conjunction with the forward look resonator bars 110. As a result the mandrel 130 is provided with a piezoelectrically active face in a plane orthogonal to the mandrel axis.

Figure 3:
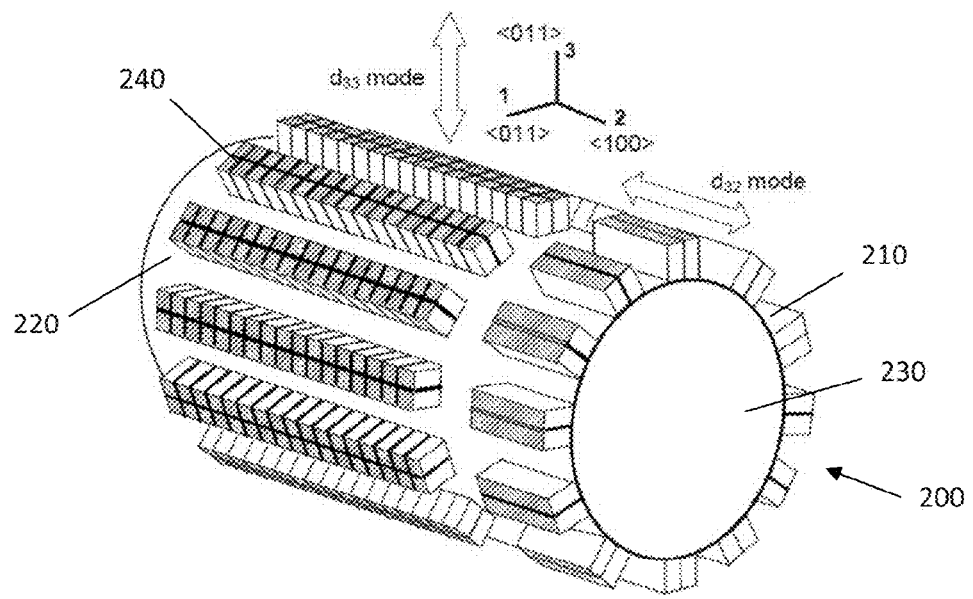
FIG. 3 illustrates a composite in accordance with yet another exemplary embodiment of the invention.

FIG. 1 illustrates a multiple-resonant composite 100, with all resonator bars 110 in the "forward look" configuration, while in FIG. 3 a multiple-resonant composite 200 is illustrated having resonator bars 240 with a longitudinal length-extensional mode ("side look") in combination with resonator bars 210 of the transverse length-extension mode, i.e., forward look.

Still referring to FIG. 3, exemplary embodiments allow a $d_{33}$-mode 1-3 composite to be incorporated in the side look. This eliminates an undesired low frequency resonance present in ceramic designs that use elongated resonator bars in the longitudinal length-extensional mode. In addition, the transverse mode can take advantage of crystal anisotropy to use the "$d_{32}$" mode, which is not available in piezoceramic.

A secondary advantage of this orientation is that the longitudinal length-extensional mode ($d_{33}$) through the <110> direction can still be used to produce an acoustic signal perpendicular to the transverse length-extensional mode, as shown in another embodiment illustrated in FIG. 3.

In FIG. 3, a composite 200 is wrapped around a mandrel 230 a single time, with multiple resonator bars 210 in the transverse length-extensional resonance mode (i.e. "forward look") in combination with a plurality of resonator bars 240 in the $d_{33}$ longitudinal length extensional resonance mode (i.e., "side look") attached to a flexible backing 220. Like the composite 100 of FIGS. 1 and 2, the composite 200 of FIG. 3 can be formed using reactive ion etching and other techniques described herein for fabrication. It will be appreciated that the side look and forward look resonator bars 110, 210 in such cases are produced from the same piezocrystal and preferably in a simultaneous fashion, resulting in having the same thickness. The longitudinal length-extensional resonator bars 240 are also oriented in the <110> family through the thickness direction, but the resonator bars 240 being formed with a high height to width aspect ratio that dictates the presence of a strong $d_{33}$ longitudinal length extensional resonance mode.

Figure 4:
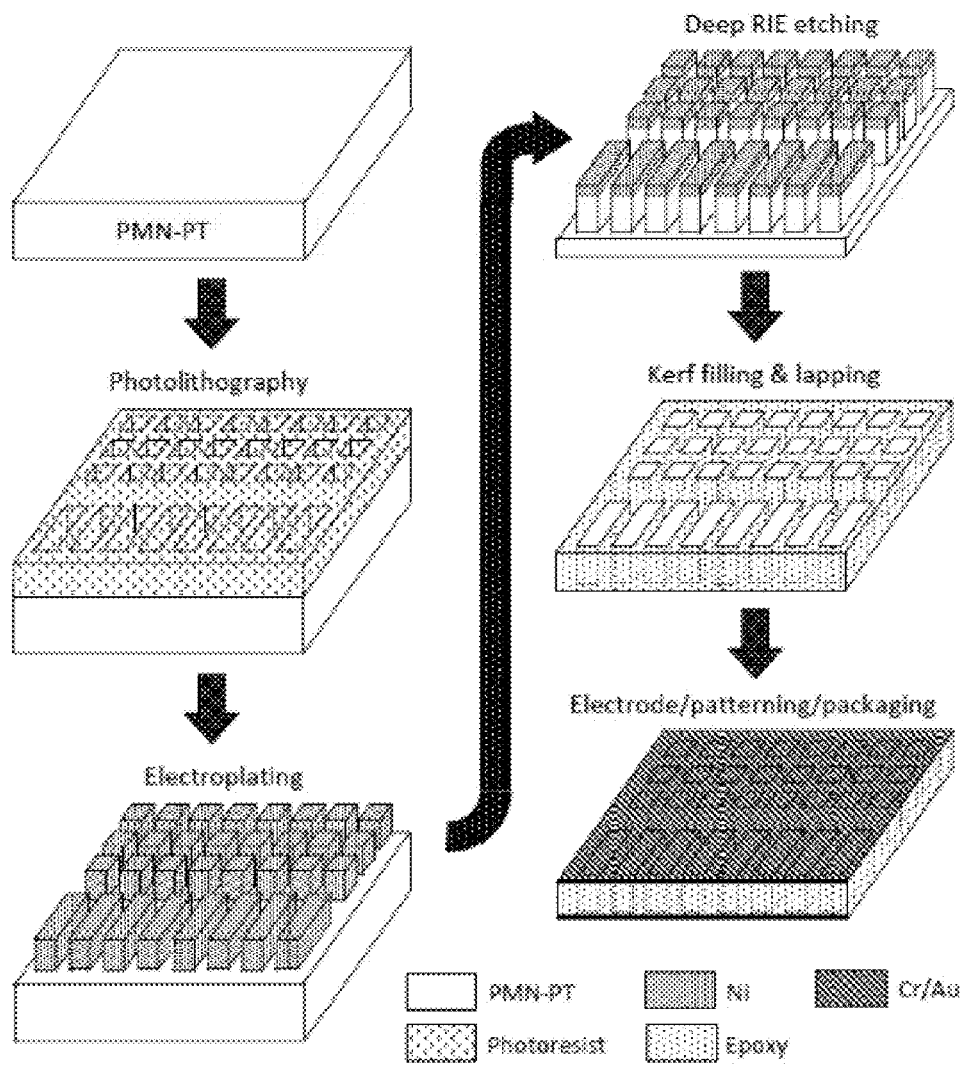
FIG. 4 schematically illustrates an exemplary set of steps for forming the resonator bars in accordance with certain exemplary embodiments.

The resonator pattern 11 may be formed in the crystal by deep reactive ion etching ("DRIE") as described in U.S. Pat. No. 8,008,842 with respect to PC-MUT devices (which are 1-3 composites operating in the $d_{33}$ mode) and which is hereby incorporated by reference in its entirety. Referring to FIG. 4 (which schematically illustrates the DRIE process), the resonators in the $d_{32}$ design (as well as $d_{33}$ in the embodiment of FIG. 3) are rectangular bars of varying length and/or width, but having a common thickness, which is the direction by which the electric field is applied. Briefly, photolithography is used to create a positive photoresist on the surface of the single crystal having the orientation desired for the resonance mode that will be used. A metal mask is then applied via electroplating, followed by a deep reactive etching that etches the crystal according to the pattern dictated by the applied mask to form a plurality of kerfs. The space formed by the etching is then filled with epoxy to create a composite structure, and the faces are lapped to remove the crystal substrate and excess epoxy, resulting in electrically independent resonator bars. Electrode material such as chrome/gold or nickel/vanadium is applied to the faces for the positive and electrical ground connections and can be patterned to create electrically independent or dependent resonator bars.

Although DRIE is preferred, a number of other processing techniques for forming the resonator pattern and producing composites are available, including traditional wet etching, a combination of wet etching and DRIE, laser machining, high precision dicing with wafer dicing saws, and electrode patterning, for example. However, because the multi-resonator pattern is complex, it may be time-consuming and difficult to achieve using a mechanical dicing technique as different length bars would be diced separately and manually placed next to each other. Non-etching techniques may also be more susceptible to risk of physical damage during manufacture and/or cross-coupling of resonance modes.

Figure 5:
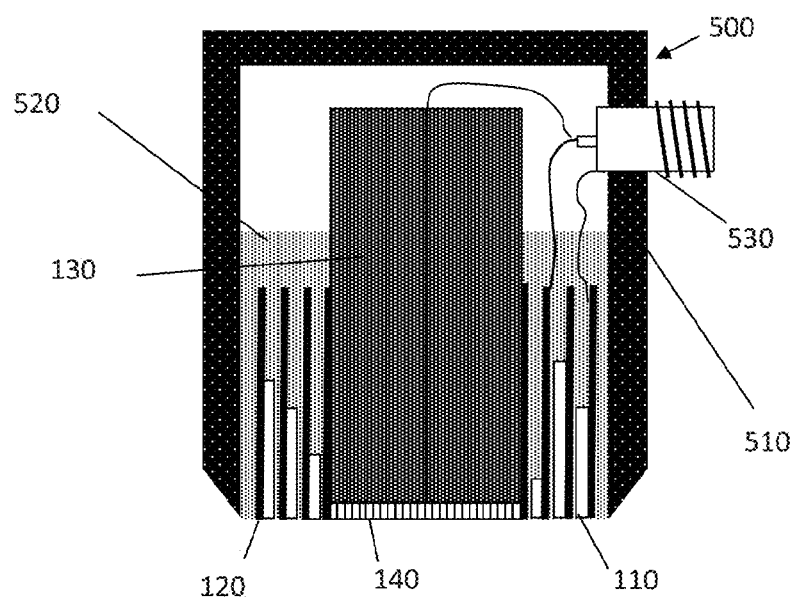
FIG. 5 illustrates a transducer that includes a composite in accordance with exemplary embodiments.

The resonator bars 110 may be applied to the flexible substrate 120 before or after etching and wrapped around the central structure 130 to provides a support in forming a transducer 500 (FIG. 5). Connection is made to positive and ground via wires, typically prior to wrapping. In FIG. 5, a schematic cross sectional view of an exemplary transducer device 500 is illustrated using the composite 100 of FIG. 2, although the transducer 500 can be formed in a similar manner regardless of particular configuration. The composite 100 is situated within a housing 510 and may be potted using an epoxy 520 to secure the composite 100 in place and which fills the space between the wrapped layers of the composite 100. Wires can be bonded to a standard connector 530 (such as BNC) to make an electrical connection between the composite 100 and the connector 530 for the transducer 500 to be operated in the usual manner.

In making the connections and as a result of the orientation of the resonator bars, transducers in accordance with exemplary embodiments operate in the transverse length-extensional mode with the electric field applied orthogonally to the extensional direction, such that resonators of different lengths share common electrodes contributing to the ability to span a wide bandwidth. It will be appreciated that the radiating faces of the $d_{32}$ resonator bars are substantially coplanar and can be driven in electrical parallel or individually, depending on the electrical inter-connection and drive system.

The transducers disclosed herein can operate as a source and/or receiver of acoustic energy. The excitation signal to the transducer may be either a wide-bandwidth signal to excite the transducer across its entire operational spectrum, or a narrow-bandwidth signal optimized for a particular measurement technique. The transducer may be operated in through-transmission mode using two transducers (for example, in measuring the signal transmitted through the calcaneus), or in pulse-echo mode (for example, measuring the signal reflected from vertebrae). The drive voltage of the transducers in accordance with exemplary embodiments can be an order of magnitude less than conventional resonators operated in the $d_{33}$ resonance mode while still maintaining comparable strain because the applied electric field is not dependent on the extensional length.

Applications for devices made in accordance with exemplary embodiments include, without limitation, wideband bone characterization, to evaluate metrics such as bone mineral density, trabecular spacing and thickness, intravascular imaging and intra-cardiac imaging. The techniques used to determine bone metrics currently require measurement over a broad range of ultrasound frequencies, and therefore complete characterization requires the use of several narrowband transducers. Other exemplary applications include, again by way of example, intravascular imaging and non-destructive testing.

The invention has been reduced to practice and transducers using the composite designs shown in each of FIGS. 1 through 3.

A composite having the multi-resonant pattern shown in FIG. 1, having five different resonator lengths, was fabricated and tested. The thickness of the resonator bars 110 in the sample was approximately 60 microns and the lateral dimensions of the five different sized bars in the pattern were: 1.80 mm×0.35 mm; 0.54 mm×0.11 mm; 0.30 mm×0.08 mm; 0.20 mm×0.07 mm and 0.14 mm×0.05 mm. The composite was formed using a PMN-PT single crystal, in which the resonator bars were fabricated using the DRIE steps previously discussed and illustrated in FIG. 4. The resonator bars were formed on a polyimide film (KAPTON). After fabrication, the film was wrapped around a wood or plastic mandrel and the resulting wrapped multi-resonant composite was used to construct a transducer.

Figure 6:
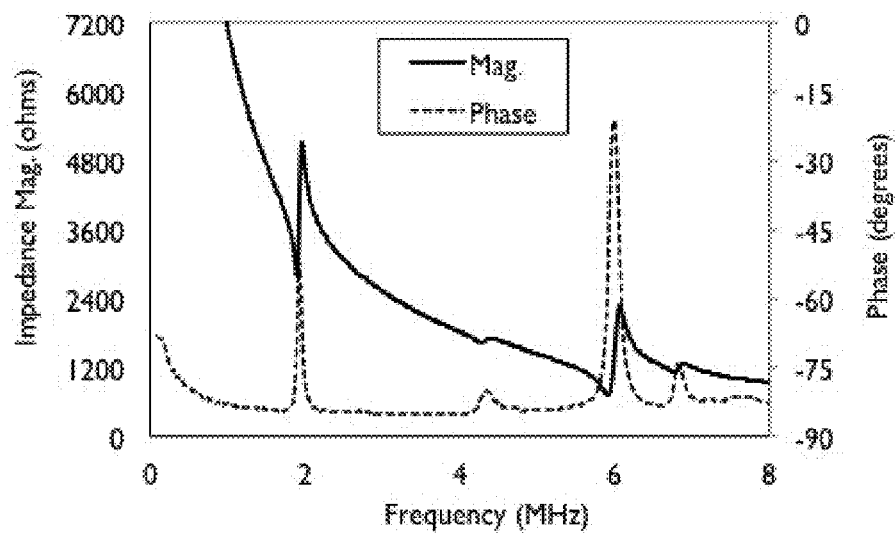
FIGS. 6 through 8b graphically illustrate measurements recorded using different exemplary embodiments.
Figure 7A:
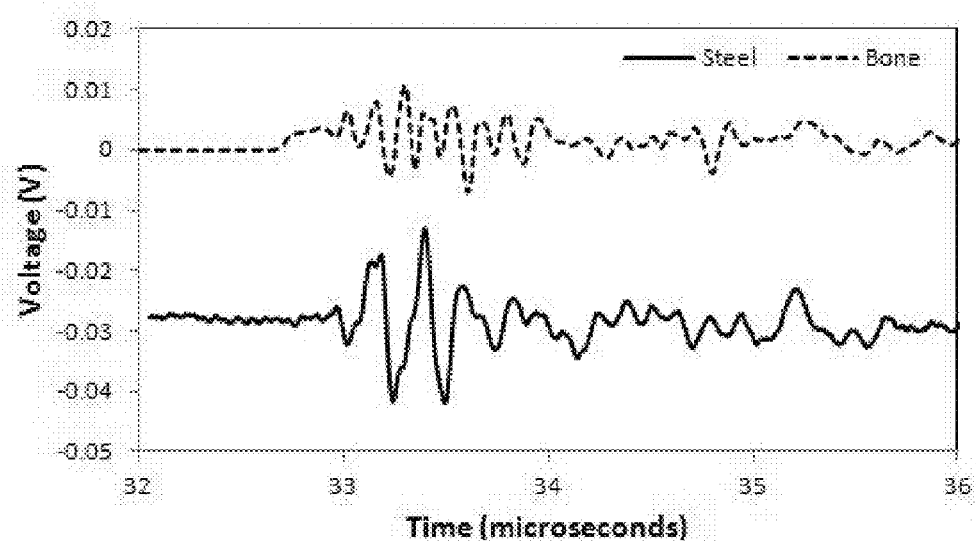
Figure 7B:
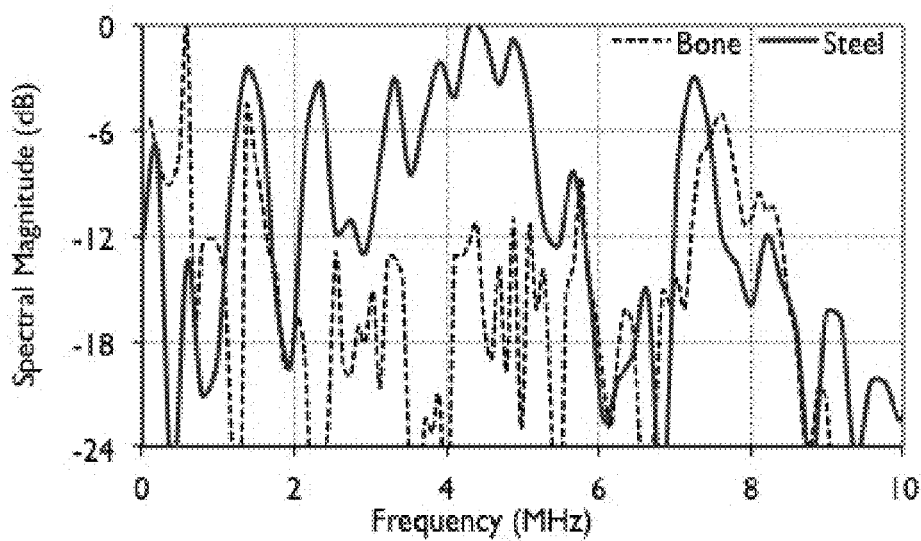

Electrical impedance and pulse-echo testing in water were performed using finished transducers having the composite shown in FIG. 1. In the impedance spectrum, multiple resonances could be seen and are shown in FIG. 6. For the pulse-echo testing, the time-domain echo received from the transducer in pulse-echo mode is shown in FIG. 7a and frequency response of the echo is shown in FIG. 7b. Peaks from the various resonators can be seen and FIG. 7b illustrates that the exemplary transducer demonstrated a bandwidth of 4 octaves, in the range 400 kHz-8 MHz. This figure also reveals that different materials showed different acoustic spectrums and peaks across the range, illustrating that exemplary embodiments of the invention can be used to ascertain material properties.

Figure 8A:
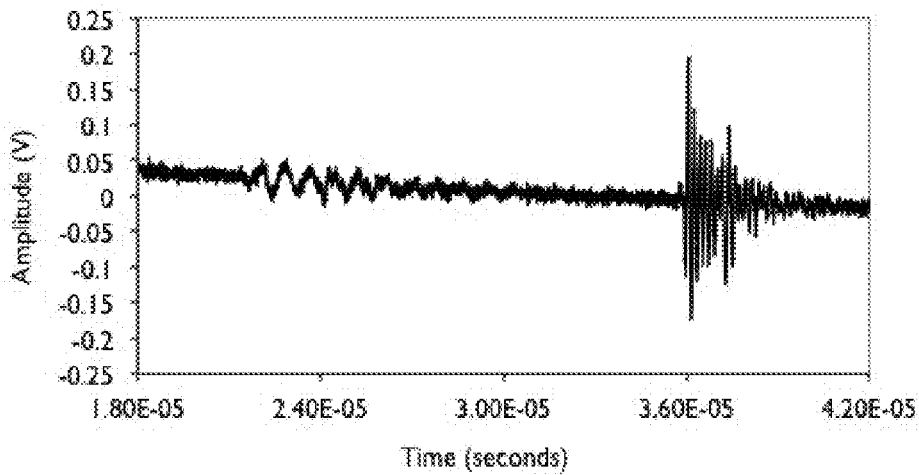
Figure 8B:
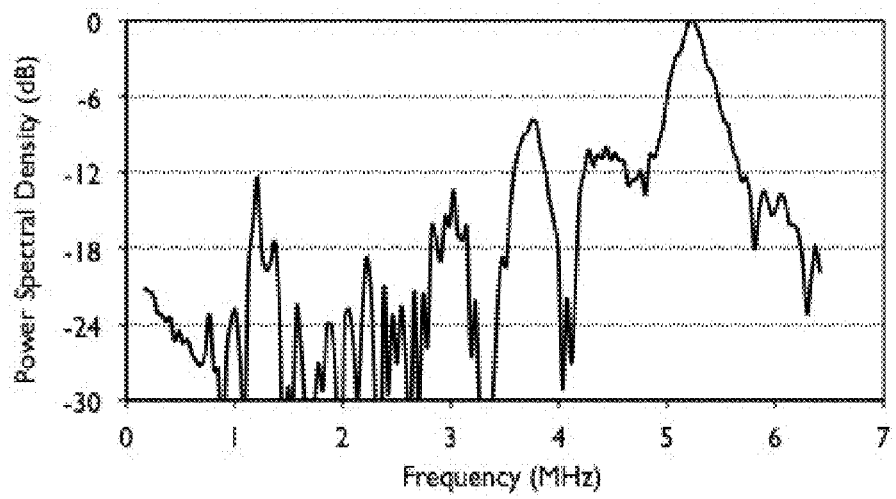

A low frequency transducer using a composite of the combination forward- and side-look shown in FIG. 3 was also made, again using PMN-PT with DRIE on a KAPTON polyimide film and formed over a plastic mandrel to create the multi-resonant composite. The thickness of the resonator bars 110, 210 of the composite sample was approximately 350 microns, with the side look resonator bars being about 200 microns wide and the forward look resonator bars having a length of about 750 microns. The forward look (i.e., $d_{32}$ mode) used a frequency less than 50% than that of the side look (i.e., $d_{33}$ mode) so that during the receive action each signal could be filtered from one another. The composite was tested with two targets at 90° from one another. Pulse-echo results from testing the transducer are shown in FIGS. 8a (time-domain) and 8b (frequency response), which illustrates the transducer showed forward echo at 23 microseconds and side echo at 36 microseconds, with a forward frequency at 1 MHz and a side frequency at 5 MHz.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A transducer comprising:
   a multiply resonant composite, the composite comprising at least two resonator bars of a piezoelectric single crystal configured in a d32 transverse length-extensional resonance mode having a crystallographic orientation set such that the thickness axis is in the <110> family and resonance direction is the <001> family, the resonator bars being of at least two different lengths to provide at least two different d32 resonant frequencies.

2. The transducer of claim 1, further comprising a resonator bar of a piezoelectric single crystal being configured in a d33 longitudinal length-extensional resonance mode.

3. The transducer of claim 1, wherein the composite is at least partially wrapped around a central structure.

4. The transducer of claim 3, wherein a plurality of resonator bars are attached to a flexible film.

5. The transducer of claim 4, wherein the composite is wrapped around the central structure more than a single revolution.

6. The transducer of claim 3, wherein the central structure is cylindrical having an axis parallel with the length dimension of the resonator bars configured for the d32 transverse length-extensional resonance mode, the central structure further having a piezoelectrically active face in a plane orthogonal to its axis.

7. The transducer of claim 1, wherein the piezoelectric single crystal is lead magnesium niobate-lead titanate (PMN-PT), indium-doped PMN-PT (PIN-PMN-PT), manganese-doped PMN-PT (Mn:PMN) or manganese-doped PIN-PMN-PT (Mn:PIN).

8. The transducer of claim 1 having a frequency range of 20 kHz to 15 MHz.

9. The transducer of claim 1 having a frequency range of 400 kHz to 8 MHz.

10. The transducer of claim 1, wherein the resonator bar has a thickness in the range of about 20 microns to about 500 microns.

11. The transducer of claim 1, wherein the resonator bar has a thickness in the range of about 20 microns to about 100 microns.

12. The transducer of claim 1, wherein the resonator bar has a thickness in the range of about 20 microns to about 50 microns.

13. The transducer of claim 1, wherein the transducer has an effective bandwidth of at least four octaves.

14. A transducer comprising:
   a multiply resonant composite, the composite comprising a plurality of resonator bars of a piezoelectric single crystal, the plurality of resonator bars configured in a d32 transverse length-extensional resonance mode having a crystallographic orientation set such that the thickness axis is in the <110> family and resonance direction is the <001> family,
   wherein the resonator bars are of at least two different lengths to produce at least two different d32 resonant frequencies, and
   wherein the resonator bars are attached to a flexible polymeric film wrapped at least one complete revolution about a cylindrical central structure having a length dimension that is parallel with the length dimension of the resonator bars.

15. The transducer of claim 14, wherein the polymeric film is wrapped a plurality of revolutions about the central structure.

16. The transducer of claim 14, wherein the transducer has an effective bandwidth of at least four octaves.

17. A transducer comprising:
a multiply resonant composite, the composite comprising a first plurality of resonator bars of a piezoelectric single crystal, each resonator bar of the first plurality of resonator bars configured in a d32 transverse length-extensional resonance mode having a crystallographic orientation set such that the thickness axis is in the <110> family and resonance direction is the <001> family,
the composite further comprising a second plurality of resonator bar of a piezoelectric single crystal, the second plurality of resonator bars each being configured in a d33 longitudinal length-extensional resonance mode,
wherein the first and second plurality of resonator bars are attached to a flexible polymeric film at least partially wrapped about a cylindrical central structure having a length dimension that is parallel with the length dimension of the first plurality of resonator bars.

18. The transducer of claim 17, wherein the first plurality of resonator bars are substantially the same length.

19. The transducer of claim 17 wherein the first plurality of resonator bars are of at least two different lengths.

20. A transducer comprising:
a multiply resonant composite, the composite comprising a resonator bar of a piezoelectric single crystal configured in a d32 transverse length-extensional resonance mode having a crystallographic orientation set such that the thickness axis is in the <110> family and resonance direction is the <001> family, wherein the composite comprises a second resonator bar of a piezoelectric single crystal, the second resonator bar being configured in a d33 longitudinal length-extensional resonance mode.

21. A transducer comprising:
a multiply resonant composite, the composite comprising a resonator bar of a piezoelectric single crystal configured in a d32 transverse length-extensional resonance mode having a crystallographic orientation set such that the thickness axis is in the <110> family and resonance direction is the <001> family, wherein a plurality of resonator bars are attached to a flexible film at least partially wrapped around a central structure.

\* \* \* \* \*